United States Patent
Yang (10) Patent No.: US 8,057,987 B2
(45) Date of Patent: Nov. 15, 2011

(54) PATTERNING METHOD OF SEMICONDUCTOR DEVICE

(75) Inventor: Cheol Hoon Yang, Suwon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 545 days.

(21) Appl. No.: 12/256,259

(22) Filed: Oct. 22, 2008

(65) Prior Publication Data

US 2009/0111059 A1    Apr. 30, 2009

(30) Foreign Application Priority Data

Oct. 26, 2007   (KR) .................. 10-2007-0108163

(51) Int. Cl.
*G03F 7/26* (2006.01)
(52) U.S. Cl. ........................ 430/313; 430/5
(58) Field of Classification Search ............ 430/313, 430/5
See application file for complete search history.

(56) References Cited

U.S. PATENT DOCUMENTS

| | | | | |
|---|---|---|---|---|
| 6,162,567 | A | * | 12/2000 | Watanabe ............... 430/5 |
| 2002/0097356 | A1 | * | 7/2002 | Kawase et al. ............ 349/106 |
| 2003/0091938 | A1 | * | 5/2003 | Fairbairn et al. ........... 430/314 |
| 2006/0240359 | A1 | * | 10/2006 | Liu ..................... 430/313 |

FOREIGN PATENT DOCUMENTS

| | | |
|---|---|---|
| JP | 2009-008933 | 1/2009 |
| KR | 10-2008-0012011 | 2/2008 |

* cited by examiner

*Primary Examiner* — Kathleen Duda
*Assistant Examiner* — Caleen Sullivan
(74) *Attorney, Agent, or Firm* — Marshall, Gerstein & Borun LLP (57) ABSTRACT

The invention relates to a patterning method of a semiconductor device. In an aspect of the invention, the method may include forming a target etch layer on a semiconductor substrate, forming a photoresist film on the target etch layer, forming photoresist patterns using exposure and development processes employing an exposure mask wherein exposure patterns, each having inclined top corners, are formed, and patterning the target etch layer using an etch process employing the photoresist patterns.

9 Claims, 7 Drawing Sheets

PATTERNING METHOD OF SEMICONDUCTOR DEVICE

CROSS-REFERENCE TO RELATED APPLICATION

Priority to Korean patent application number 10-2007-0108163 filed Oct. 26, 2007, the entire disclosure of which is incorporated by reference, is claimed.

BACKGROUND OF THE INVENTION

The invention relates generally to a patterning method of a semiconductor device and, more particularly, to a patterning method of a semiconductor device, wherein an abrupt winding of a layer, which becomes a target, is eased by modifying an exposure mask pattern, thereby subsequently forming a uniform layer.

A semiconductor device includes a cell area for storing data and a peripheral ("peri") area. An area where the cell and peri areas are formed on a wafer is called a die. A plurality of such dies is formed on a sheet of the wafer. The dies are isolated from each other with scribe lanes intervening therebetween.

Figure 1A:
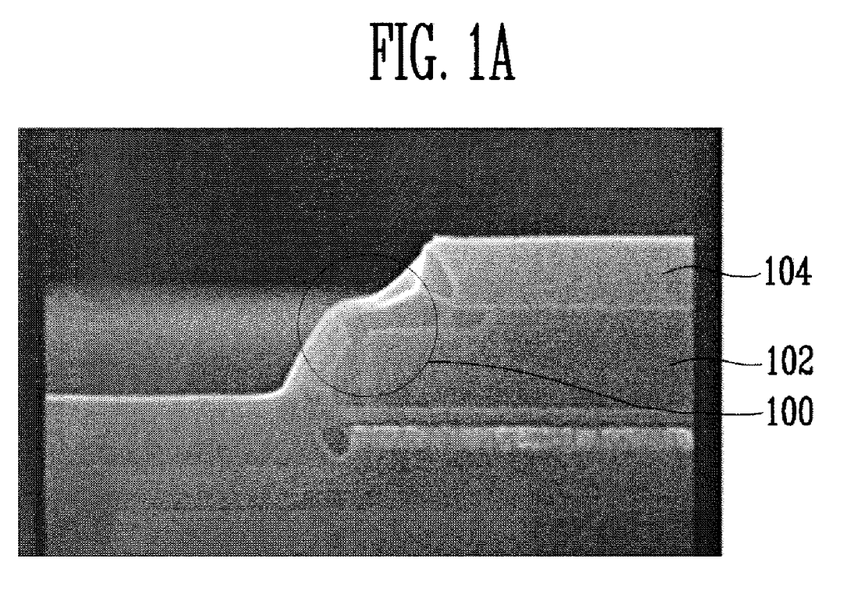
FIGS. 1A and 1B are photographs showing a conventional overlay vernier pattern.
Figure 1B:
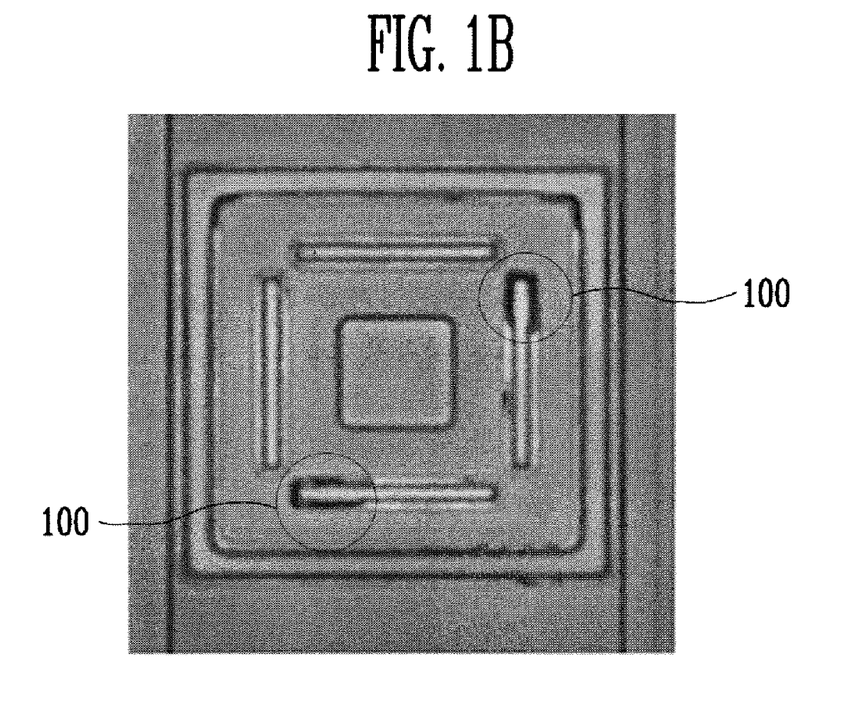

As described above, elements having different pattern sizes are formed on a semiconductor substrate. In particular, as semiconductor devices have become more highly integrated, the width of a pattern and a gap between the patterns have decreased, so that the step of the pattern is gradually increased. Particularly, it may become difficult to form a subsequent layer since the pattern may have a wide open area. More specifically, overlay vernier patterns for alignment in the fabrication process of a semiconductor device are contained within the scribe lane area. The overlay vernier patterns have a gap wider than those of memory cell patterns of the cell area. If a layer is formed in a subsequent process, the formed layer may become weak at corner areas due to sharp pattern windings of the overlay vernier patterns. This is described in more detail with reference to photographs of FIG. 1.

FIGS. 1A and 1B are photographs showing a conventional overlay vernier pattern.

FIG. 1A shows a sectional view of an overlay vernier pattern of a semiconductor device wherein a corner of an overlay vernier pattern 102 has a sharp pattern winding 100. From FIG. 1A, it can be seen that, when a subsequent layer 104 is formed on the overlay vernier pattern 102 having the sharp pattern winding 100, a defects occurs at the area where the sharp pattern winding 100 is generated. This is because, since the subsequent layer 104 is weakly formed in the sharp pattern winding (100) area, a part of the overlay vernier pattern 102 can be exposed in a subsequent etch process, resulting in a defect.

FIG. 1B is a plan view of the overlay vernier pattern having defects 100 as in FIG. 1A. (The overlay vernier pattern is a pattern for alignment in the fabrication process of a semiconductor device.) If the defects 100 are generated as in FIG. 1B, it may become very difficult to perform accurate alignment, resulting in a low yield.

BRIEF SUMMARY OF THE INVENTION

The invention is directed to a patterning method of a semiconductor device, wherein the corners of an exposure mask pattern are formed aslant (i.e., obliquely) to make the outer areas of a photoresist pattern vulnerable to an etch process, so a target etch layer can be formed aslant in a subsequent etch process and therefore defects occurring at corner areas of the target etch layer can be prevented.

Further, the invention is directed to a patterning method of a semiconductor device, wherein exposure mask patterns are formed from materials having different transmittances to make the outer areas of a photoresist pattern vulnerable to an etch process, so the corners of a target etch layer can be formed aslant.

A patterning method of a semiconductor device according to an aspect of the invention includes forming a target etch layer on a semiconductor substrate, forming a photoresist film on the target etch layer, forming photoresist patterns using exposure and development processes employing an exposure mask wherein exposure patterns, each exposure pattern having inclined top corners, are formed, and patterning the target etch layer using an etch process employing the photoresist patterns.

A patterning method of a semiconductor device according to another aspect of the invention includes forming a target etch layer on a semiconductor substrate, the substrate including a first area and second areas wherein patterns are to be formed more densely in the second areas than in the first area, forming a photoresist film on the target etch layer, forming photoresist patterns using exposure and development processes employing an exposure mask whereby exposure patterns, each having inclined top corners, at a portion corresponding to the first area are formed, and patterning the target etch layer using an etch process employing the photoresist patterns.

Top corners of the photoresist pattern formed in the first area are preferably inclined by the exposure patterns having the inclined top corners.

Top corners of the target etch layer are preferably etched aslant in the first area by the photoresist patterns having the inclined top corners. Here, the first area is preferably a scribe lane area.

A patterning method of a semiconductor device according to still another aspect of the invention includes forming a target etch layer on a semiconductor substrate, forming a photoresist film on the target etch layer, forming photoresist patterns using exposure and development processes employing an exposure mask wherein exposure patterns, each having a center and corners with a different light transmittance, are formed, and patterning the target etch layer using an etch process employing the photoresist patterns.

The corners of the exposure pattern are preferably formed from materials having light transmittance higher than that of the center. The center of the exposure pattern is preferably formed from chromium (Cr). The corners of the exposure pattern are preferably formed from MoSi.

A patterning method of a semiconductor device according to still another aspect of the invention includes forming a target etch layer on a semiconductor substrate, including a first area and second areas wherein patterns are to be formed more densely than in the first area, forming a photoresist film on the target etch layer, forming photoresist patterns using exposure and development processes employing an exposure mask wherein exposure patterns, each having a center and corners with a different light transmittance in the first area, are formed, and patterning the target etch layer using an etch process employing the photoresist patterns.

The first area of the photoresist pattern preferably is physically more dense than the second area. The first area is preferably a scribe lane area. Further, the target etch layer preferably has its top corners inclined according to the photoresist patterns.

A patterning method of a semiconductor device according to still another aspect of the invention includes forming a target etch layer on a semiconductor substrate, forming a photoresist film on the target etch layer, performing exposure and development processes for forming the photoresist film as photoresist patterns by employing an exposure mask including exposure patterns, each having corners with a thickness thinner than that of corners, and patterning the target etch layer along the photoresist patterns.

The exposure mask is preferably formed by forming the exposure patterns on a quartz substrate. Light transmittance is preferably controlled according to a difference in the thickness of the center and the corners of the exposure pattern. Light transmittance of the corners of the exposure pattern is preferably higher than that of the center of the exposure pattern.

DESCRIPTION OF SPECIFIC EMBODIMENTS

The invention is described in detail below in connection with specific embodiments with reference to the accompanying drawings. The illustrated embodiments are provided to complete the disclosure of the invention and to allow those having ordinary skill in the art to understand the scope of the invention. When it is said that any part, such as a layer, film, area, or plate, is positioned on another part, it means the part is directly on the other part or above the other part with at least one intermediate part. To clarify multiple layers and regions, the thickness of the layers is enlarged in the drawings.

FIGS. 2A to 2D are sectional views showing a patterning method of a semiconductor device in accordance with an embodiment of the invention.

Figure 2A:
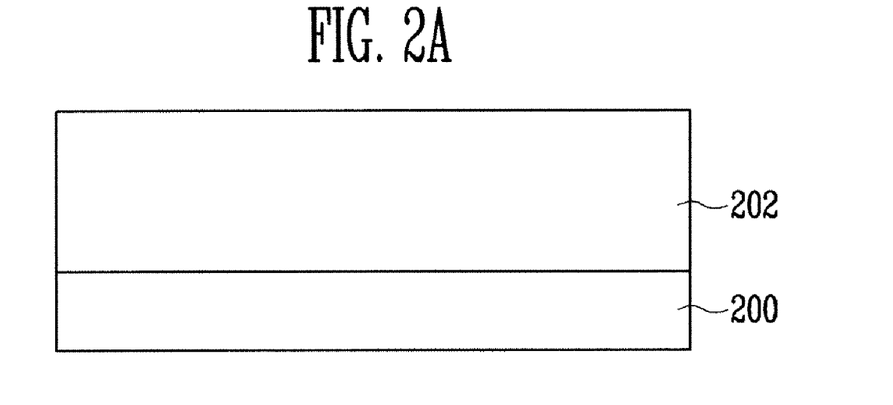
FIGS. 2A to 2D are sectional views showing a patterning method of a semiconductor device in accordance with an embodiment of the invention.

FIG. 2A is a sectional view showing an area (for example, a scribe lane area) wherein patterns having a wide gap are formed in a semiconductor substrate 200. A target etch layer 202 is formed on the semiconductor substrate 200. In the case of a flash memory device, the target etch layer 202 can have a stack structure of a tunnel insulating layer (not shown), a first conductive layer (not shown), a dielectric layer (not shown) and a second conductive layer (not shown). A pre-metal dielectric layer (not shown) may be further formed on the second conductive layer (not shown).

Figure 2B:
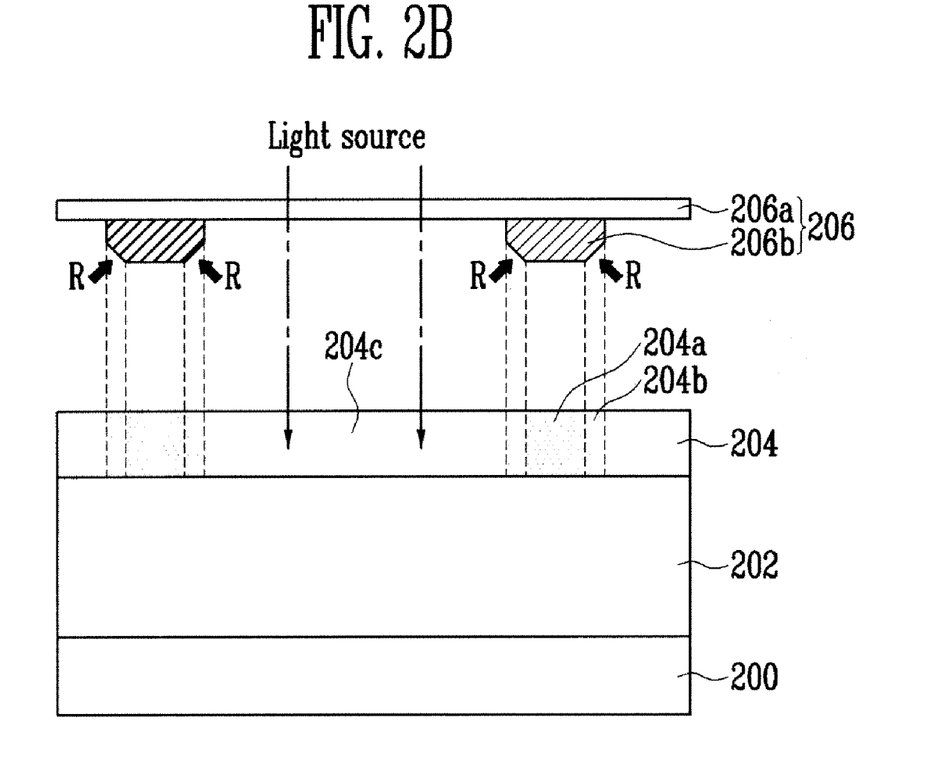

Referring to FIG. 2B, a photoresist film 204 is formed on the target etch layer 202. To pattern the photoresist film 204, an exposure process using an exposure mask 206 is performed. The exposure mask 206 has exposure patterns 206b formed in a quartz substrate 206a. Hereinafter, an exposure process performed in the scribe lane area is described as an example. Here, areas wherein the exposure patterns 206b are formed do not have a light source pass through them, and thus become non-exposure areas. Areas wherein the exposure patterns 206b are not formed have a light source pass through them, and thus become exposure areas. The exposure patterns 206b are preferably formed from chromium (Cr). The exposure patterns 206b are described in more detail below.

The exposure process is preferably performed by irradiating the light source onto the photoresist film 204 along the exposure mask 206. In particular, since the light source has a wavelength, the exposure areas of the photoresist film 204 may be influenced by the shapes of the exposure patterns 206b.

Accordingly, a corner R of the exposure pattern 206b of the exposure mask 206 is preferably smooth or inclined (or rounded). In an area wherein dense patterns are formed as in a memory cell area, the corners of the exposure patterns 206b are not formed aslant. That is, the same exposure mask pattern is used, and general exposure patterns are formed in an area (for example, a cell area) having dense patterns, but exposure patterns having inclined corners are formed in an area (for example, a scribe lane area) not having dense patterns. As described above, since the exposure process is performed along the exposure patterns 206b with the inclined corners, the photoresist film 204 is divided into a first area 204a, second areas 204b, and a third area 204c along the exposure ratio. More specifically, the first area 204a becomes a non-exposure area onto which the light source is not irradiated, and the third area 204c becomes an exposure area onto which the light source is irradiated. In particular, the second areas 204b are classified as non-exposure areas, but have a different physical property from that of the first and third areas 204a and 204c due to overlapping of the light source. That is, in a development process performed after the photoresist film 204 is light exposed, a part of the second area 204b may be removed. This is described in more detail with reference to the accompanying drawings.

Figure 2C:
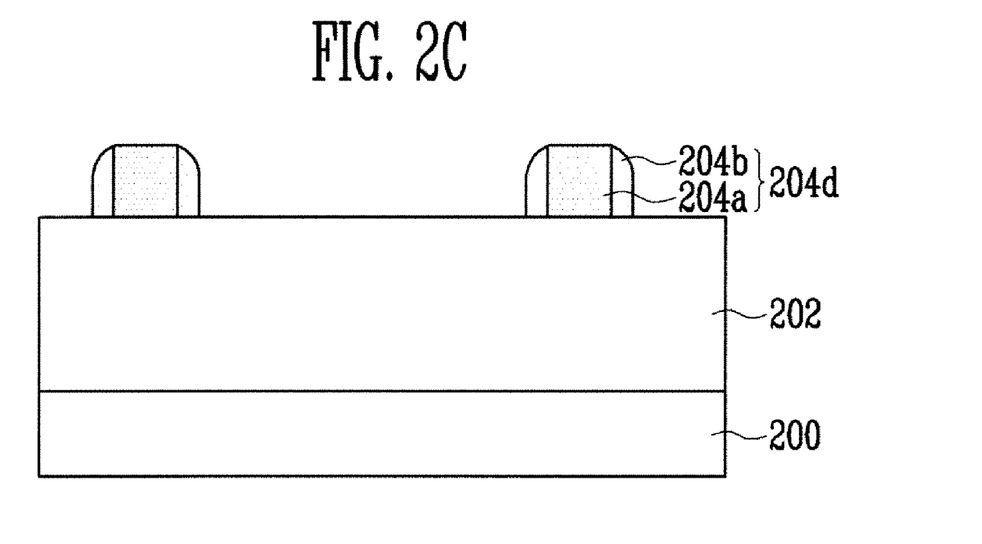

Referring to FIG. 2C, a development process is performed to form photoresist patterns 204d. At the time of the development process, the second area 204b of the photoresist pattern 204d is not physically denser than the first area 204a and therefore has its top partially removed. Thus, the second area 204b has a tapered shape from the top to the bottom. This may cause a difference in the patterning shape of the target etch layer 202 in a subsequent etch process. Consequently, corners of the photoresist pattern 204d have inclined (or curved) shapes not a straight line.

Figure 2D:
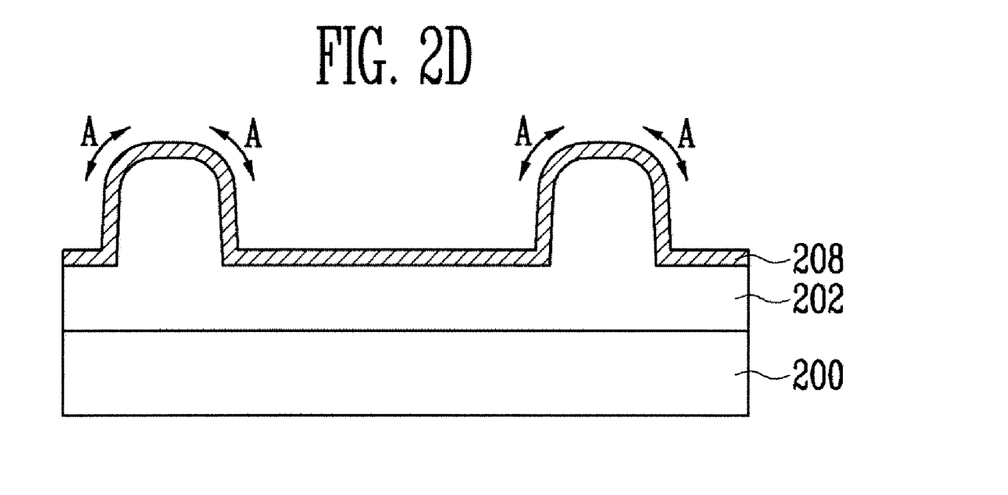

Referring to FIG. 2D, the exposed target etch layer 202 is etched by performing an etch process along the photoresist patterns (refer to 204d of FIG. 2C). For example, in the event of the overlay vernier area, the target etch layer 202 may be formed as an overlay vernier pattern and typically has a depth of 5000 angstrom to 8000 angstrom. In particular, at the time of the etch process, the outer portions of the second areas (refer to 204b of FIG. 2C) with a different etch selectivity in the photoresist patterns (refer to 204d of FIG. 2C) are first gradually removed, thus exposing the target etch layer 202 below the second areas (refer to 204b of FIG. 2C). Consequently, pattern corners A of the target etch layer 202 also have rounded shapes. As described above, since corners having abrupt windings are not formed in the patterns of the target etch layer 202, a subsequent thin film 208 (for example, a hard mask layer, a conductive layer or an insulating layer) having a uniform thickness can be formed on the target etch layer 202. In particular, since the thin film 208 having a uniform thickness can also be formed in the corner (A) areas of the patterned target etch layer 202, defects through which the target etch layer 202 is exposed can be prevented even if a subsequent etch process is performed.

FIGS. 3A to 3D are sectional views showing a patterning method of a semiconductor device in accordance with another embodiment of the invention.

Figure 3A:
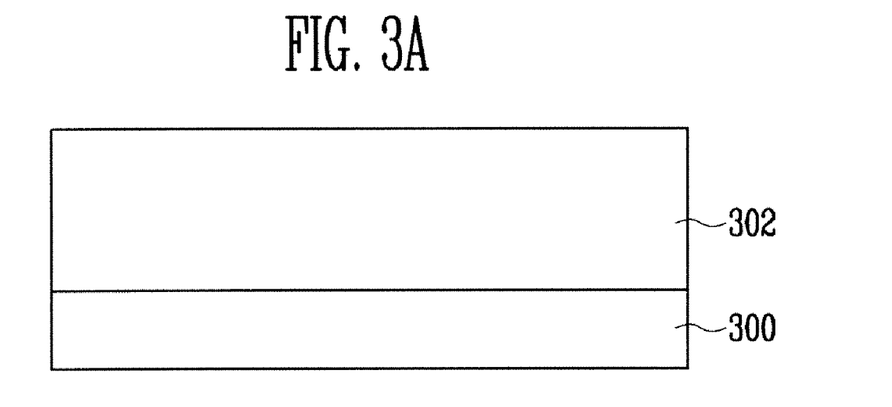
FIGS. 3A to 3D are sectional views showing a patterning method of a semiconductor device in accordance with another embodiment of the invention.

FIG. 3A is a sectional view showing an area (for example, a scribe lane area) wherein patterns having a wide gap are formed in a semiconductor substrate 300. A target etch layer 302 is formed on the semiconductor substrate 300. In the case of flash memory, the target etch layer 302 can have a stack structure of a tunnel insulating layer (not shown), a first conductive layer (not shown), a dielectric layer (not shown) and a second conductive layer (not shown). A pre-metal dielectric layer (not shown) may be further formed on the second conductive layer (not shown).

Figure 3B:
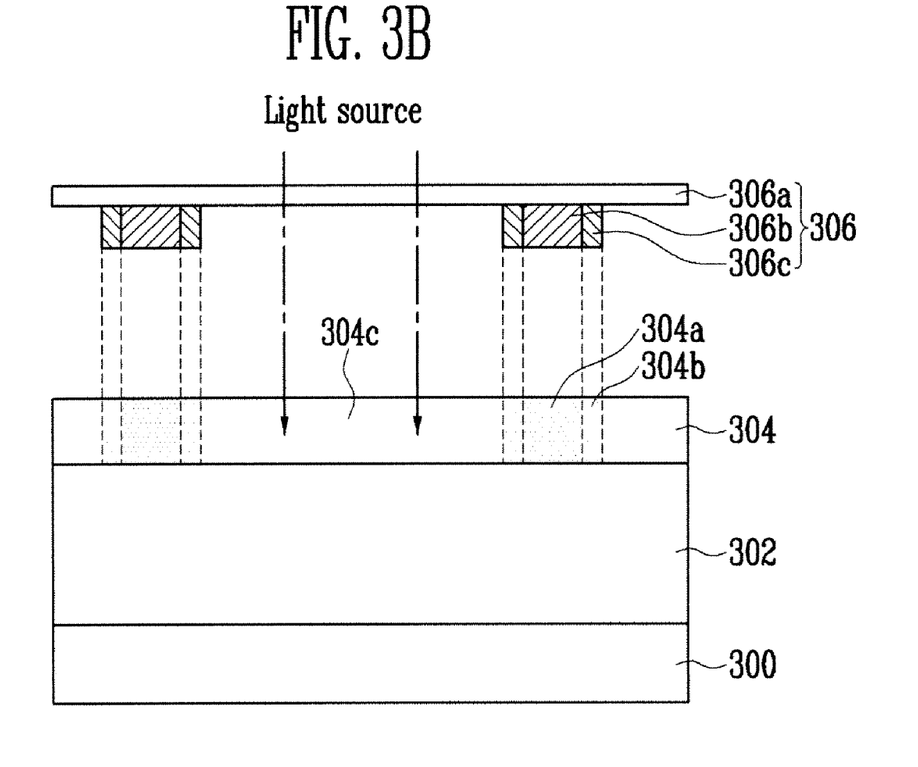

Referring to FIG. 3B, a photoresist film 304 is formed on the target etch layer 302. To pattern the photoresist film 304, an exposure process using an exposure mask 306 is performed. The exposure mask 306 has exposure patterns 306b, 306c formed in a quartz substrate 306a. Hereinafter, an exposure process performed in the scribe lane area is described as an example.

The exposure mask 306 can be used by forming the exposure patterns 306b and 306c on the quartz substrate 306a. At this time, areas wherein the exposure patterns 306b and 306c are formed do not have a light source pass through them, thus becoming non-exposure areas. Areas wherein the exposure patterns 306b and 306c are not formed have a light source pass through them, thus becoming exposure areas.

In particular, the exposure patterns 306b and 306c include a center 306b and corners 306c with a different light transmittance. The center 306b is preferably formed from chromium (Cr), and the corners 306 are preferably formed from materials having light transmittance higher than that of the center 306b. For example, the corners 306c is preferably formed from MoSi.

Next, if an exposure process is performed, a first area 304a, second areas 304b, and a third area 304c are formed in the photoresist film 304 according to the transmittance of the light source. More specifically, the first area 304a becomes a non-exposure area onto which the light source is not irradiated, and the third area 304c becomes an exposure area onto which the light source is irradiated. In particular, the second areas 304b can be classified as non-exposure areas, but have the light source irradiated thereon due to its light transmittance, thus having the physical properties different from those of the first and third areas 304a and 304c. That is, in a development process performed after the photoresist film 304 is light exposed, a part of the second area 304b may be removed. This is described in more detail with reference to the accompanying drawings.

Figure 3C:
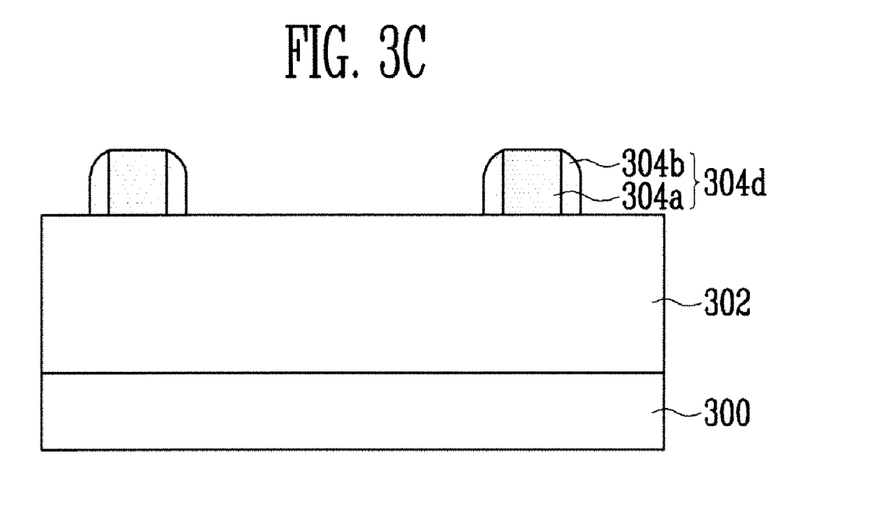

Referring to FIG. 3C, a development process is performed to form photoresist patterns 304d. At the time of the development process, the second area 304b of the photoresist pattern 304d is not physically denser than the first area 304a and therefore has its top partially removed. Thus, the second area 304b has a tapered shape from the top to the bottom. Consequently, corners of the photoresist pattern 304d have inclined shapes not abrupt windings.

Figure 3D:
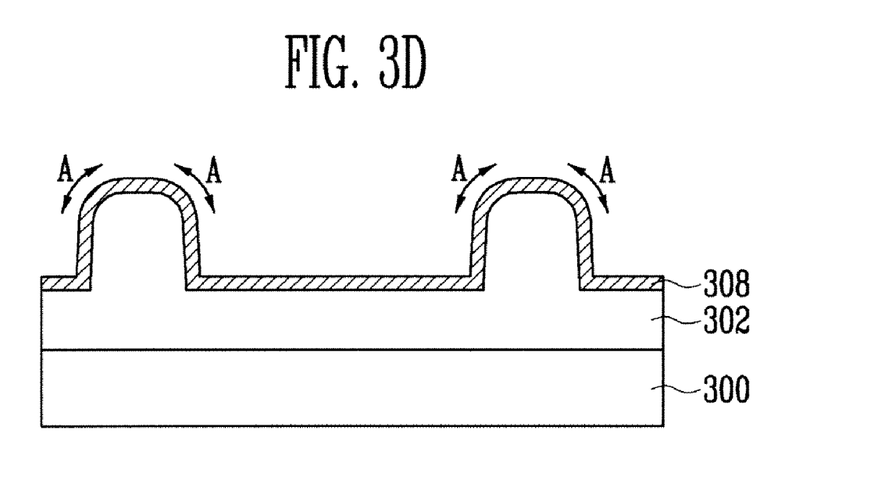

Referring to FIG. 3D, the exposed target etch layer 302 is etched by performing an etch process along the photoresist patterns (refer to 304d of FIG. 3C). For example, in the event of the overlay vernier area, the target etch layer 302 can be formed as an overlay vernier pattern. In particular, at the time of the etch process, the outer portions of the second areas (refer to 304b of FIG. 3C), which are not physically dense in the photoresist pattern (refer to 304d of FIG. 3C), are gradually removed, thus exposing the target etch layer 302 below the second areas (refer to 304b of FIG. 3C). Accordingly, pattern corners A of the target etch layer 302 also have inclined shapes. As described above, since corners having abrupt windings are not formed in the patterns of the target etch layer 302, a subsequent thin film 308 (for example, a hard mask layer, a conductive layer, or an insulating layer) having a uniform thickness can be formed on a top surface of the target etch layer 302. In particular, since the thin film 308 having a uniform thickness can also be formed in the corner (A) areas of the patterned target etch layer 302, defects through which the target etch layer 302 is exposed can be prevented even if a subsequent etch process is performed.

FIGS. 4A to 4D are sectional views showing a patterning method of a semiconductor device in accordance with still another embodiment of the invention.

Figure 4A:
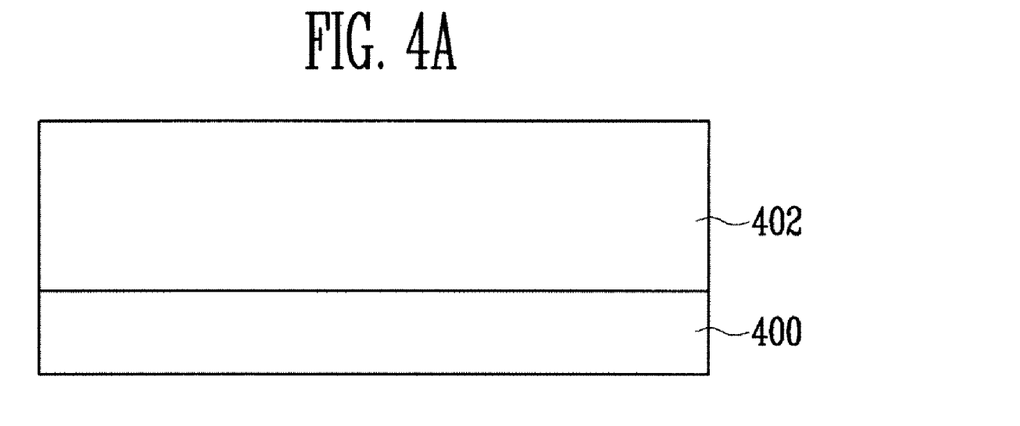
FIGS. 4A to 4D are sectional views showing a patterning method of a semiconductor device in accordance with still another embodiment of the invention.

FIG. 4A is a sectional view showing an area (for example, a scribe lane area) wherein patterns having a wide gap are formed in a semiconductor substrate 400. A target etch layer 402 is formed on the semiconductor substrate 400. In the case of flash memory, the target etch layer 402 can have a stack structure of a tunnel insulating layer (not shown), a first conductive layer (not shown), a dielectric layer (not shown) and a second conductive layer (not shown). A pre-metal dielectric layer (not shown) may be further formed on the second conductive layer (not shown).

Figure 4B:
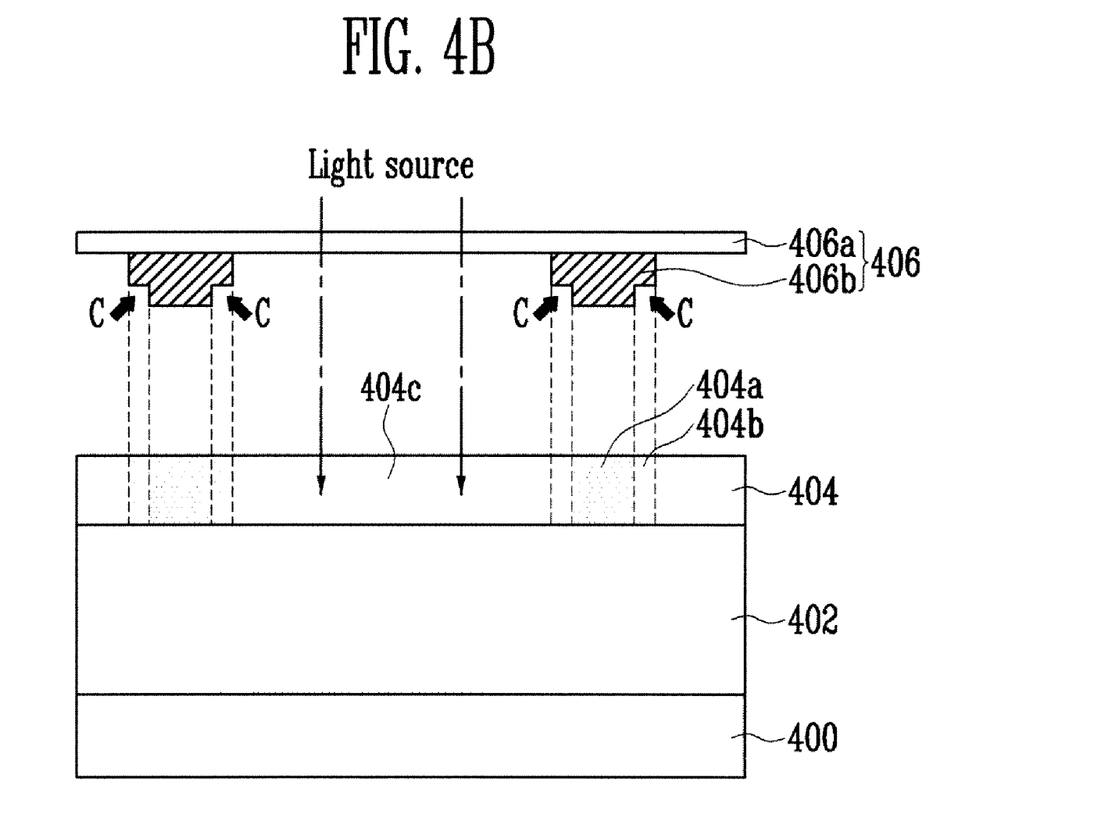

Referring to FIG. 4B, a photoresist film 404 is formed on the target etch layer 402. To pattern the photoresist film 404, an exposure process using an exposure mask 406 is performed. The exposure mask 406 has exposure patterns 406b formed in a quartz substrate 406a. Hereinafter, an exposure process performed in the scribe lane area is described as an example. Here, areas wherein the exposure patterns 406b are formed do not have a light source pass through them, thus becoming non-exposure areas. Areas wherein the exposure patterns 406b are not formed have a light source pass through them, thus becoming exposure areas. The exposure patterns 406b is preferably formed from chromium (Cr). The exposure patterns 406b are described in more detail below.

The exposure process is performed by irradiating the light source onto the photoresist film 404 along the exposure mask 406. In particular, since the light source has a wavelength, the exposure areas of the photoresist film 404 may be influenced by the shapes of the exposure patterns 406b.

Accordingly, the exposure patterns 406b of the exposure mask 406 preferably have a center, and corners C thinner than the center. An area wherein dense patterns are formed as in a memory cell area corresponds to the center of the exposure patterns 406b. That is, the same exposure mask pattern is used, and general exposure patterns are formed in an area (for example, a cell area) having dense patterns, but exposure patterns having inclined corners are formed in an area (for example, a scribe lane area) not having dense patterns. As described above, since the exposure process is performed along the exposure patterns 406b with the thinner corners, the photoresist film 404 is divided into a first area 404a, second areas 404b, and a third area 404c along the exposure ratio. More specifically, the first area 404a becomes a non-exposure area onto which the light source is not irradiated, and the third area 404c becomes an exposure area onto which the light source is irradiated. In particular, the second areas 404b are classified as non-exposure areas, but have a different physical property from that of the first and third areas 404a and 404c due to overlapping of the light source. That is, in a development process performed after the photoresist film 404 is light exposed, a part of the second area 404b may be removed. This is described in more detail with reference to the accompanying drawings.

Figure 4C:
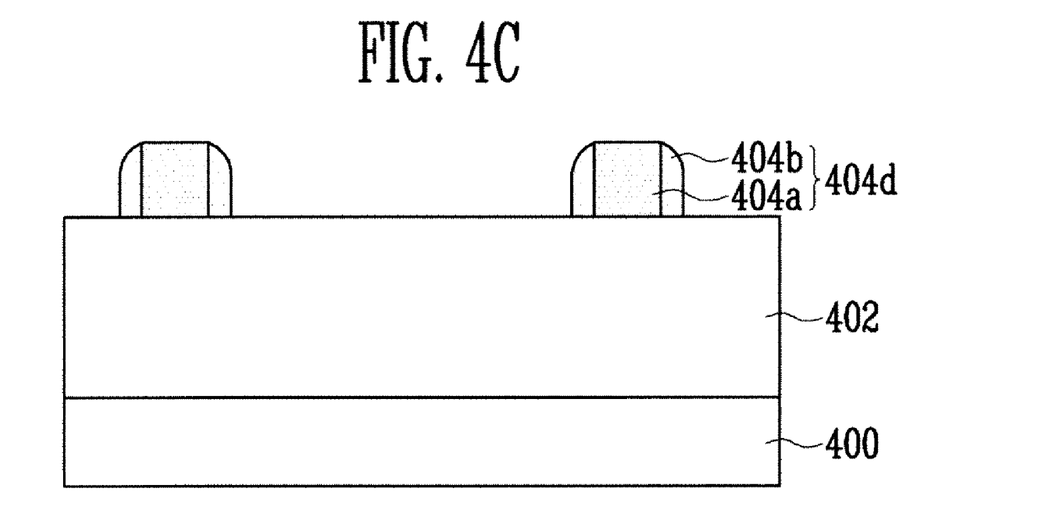

Referring to FIG. 4C, a development process is performed to form photoresist patterns 404d. At the time of the development process, the second area 404b of the photoresist pattern 404d is not physically denser than the first area 404a and therefore has its top partially removed. Thus, the second area 404*b* has a tapered shape from the top to the bottom. This may cause a difference in the patterning shape of the target etch layer 402 in a subsequent etch process. Consequently, corners of the photoresist pattern 404*d* have inclined (or curved) shapes not a straight line.

Figure 4D:
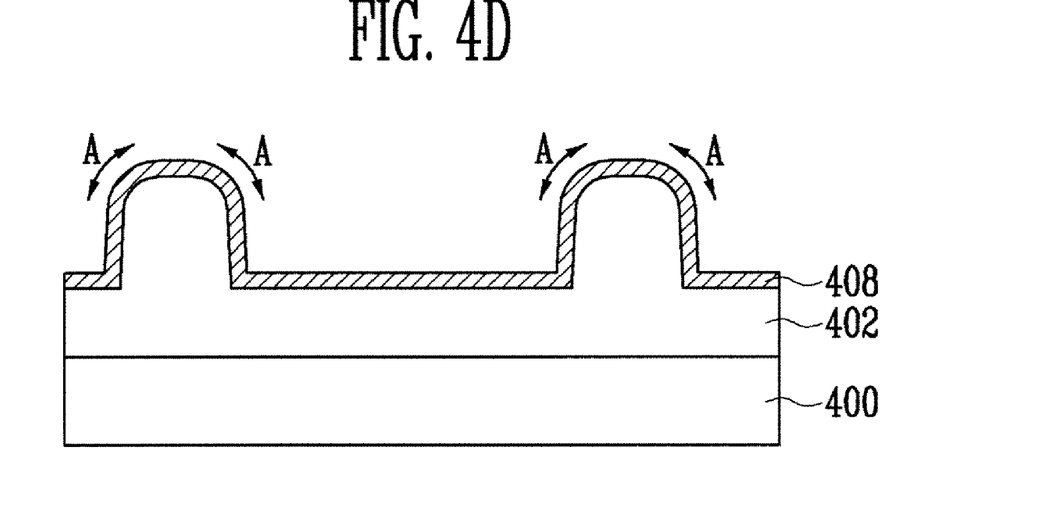

Referring to FIG. 4D, the exposed target etch layer 402 is etched by performing an etch process along the photoresist patterns (refer to 404*d* of FIG. 4C). For example, in the event of the overlay vernier area, the target etch layer 402 is preferably formed as an overlay vernier pattern and preferably has a depth of 5000 angstrom to 8000 angstrom. In particular, at the time of the etch process, the outer portions of the second areas (refer to 404*b* of FIG. 4C) with a different etch selectivity in the photoresist patterns (refer to 404*d* of FIG. 4C) are first gradually removed, thus exposing the target etch layer 402 below the second areas (refer to 404*b* of FIG. 4C). Consequently, pattern corners A of the target etch layer 402 also have rounded shapes. As described above, since corners having abrupt windings are not formed in the patterns of the target etch layer 402, a subsequent thin film 408 (for example, a hard mask layer, a conductive layer or an insulating layer) having a uniform thickness can be formed on the target etch layer 402. In particular, since the thin film 408 having a uniform thickness can also be formed in the corner (A) areas of the patterned target etch layer 402, defects through which the target etch layer 402 is exposed can be prevented even if a subsequent etch process is performed.

As described above, pattern corners of a target etch layer are formed aslant by modifying an exposure mask pattern, so that the thickness of a subsequent layer can be uniformly formed. Accordingly, vulnerable portions that may occur in a subsequent etch process can be prevented and, therefore, pattern damage to a target etch layer can be prevented.

The embodiments disclosed herein have been disclosed to allow a person skilled in the art to easily implement the invention, and the person skilled in the part may implement the invention by a combination of these embodiments. Therefore, the scope of the invention is not limited by or to the embodiments as described above, and should be construed to be defined only by the appended claims and their equivalents.

What is claimed is:

1. A method of patterning a semiconductor device, comprising:
   forming a target etch layer on a semiconductor substrate;
   forming a photoresist film on the target etch layer;
   forming photoresist patterns using exposure and development processes employing an exposure mask comprising a quartz substrate and chromium patterns that are formed on the quartz substrate, wherein the chromium patterns have inclined top corners; and
   patterning the target etch layer using an etch process employing the photoresist patterns.

2. A patterning method of a semiconductor device, comprising:
   forming a target etch layer on a semiconductor substrate, the substrate comprising a first area and second areas for formation of patterns wherein said patterns are to be more densely formed in the second areas than in the first area;
   forming a photoresist film on the target etch layer;
   forming photoresist patterns using exposure and development processes employing an exposure mask comprising a quartz substrate and chromium patterns that are formed on the quartz substrate, wherein the chromium patterns have inclined top corners in a portion corresponding to the first area; and
   patterning the target etch layer using an etch process employing the photoresist patterns.

3. The patterning method of claim 2, comprising inclining top corners of the photoresist patterns formed in the first area by the chromium patterns having the inclined top corners.

4. The patterning method of claim 3, comprising etching aslant the top corners of the target etch layer in the first area by the photoresist patterns having the inclined top corners.

5. The patterning method of claim 2, wherein the first area is a scribe lane area.

6. A patterning method of a semiconductor device, comprising:
   forming a target etch layer on a semiconductor substrate;
   forming a photoresist film on the target etch layer;
   performing exposure and development processes on the photoresist film to form photoresist patterns by employing an exposure mask comprising chromium patterns having a center and corners, with the corners having a thickness thinner than that of the center; and
   patterning the target etch layer along the photoresist patterns.

7. The patterning method of claim 6, comprising forming the exposure mask by forming the chromium patterns on a quartz substrate.

8. The patterning method of claim 6, comprising controlling light transmittance according to a difference in the thickness of the center and the corners of the chromium patterns.

9. The patterning method of claim 8, wherein light transmittance of the corners of the chromium patterns is higher than that of the center of the chromium patterns.

* * * * *